United States Patent
Cox et al.

(10) Patent No.: US 6,275,965 B1
(45) Date of Patent: Aug. 14, 2001

(54) METHOD AND APPARATUS FOR EFFICIENT ERROR DETECTION AND CORRECTION IN LONG BYTE STRINGS USING GENERALIZED, INTEGRATED, INTERLEAVED REED-SOLOMON CODEWORDS

(75) Inventors: Charles Edwin Cox, San Jose; Martin Aureliano Hassner, Mountain View; Arvind Patel, San Jose, all of CA (US); Barry Marshall Trager, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/260,717

(22) Filed: Mar. 1, 1999

Related U.S. Application Data (63) Continuation-in-part of application No. 08/971,796, filed on Nov. 17, 1997, now Pat. No. 5,946,328.

(51) Int. Cl.[7] .................................................. H03M 13/29
(52) U.S. Cl. ........................................ 714/755; 714/762
(58) Field of Search .................................... 714/755, 761, 714/762, 784

(56) References Cited

U.S. PATENT DOCUMENTS

| | | | |
|---|---|---|---|
| 4,525,838 | 6/1985 | Patel | 371/37.4 |
| 4,706,250 * | 11/1987 | Patel | 371/39 |
| 4,849,975 * | 7/1989 | Patel | 371/38 |
| 4,916,701 * | 4/1990 | Eggenberger et al. | 371/37.7 |
| 4,951,284 * | 8/1990 | Abdel-Gaffer et al. | 371/38.1 |
| 5,428,628 | 6/1995 | Hassner et al. | 371/37.1 |

OTHER PUBLICATIONS

G. Clark et al., Error Correction Coding for Digital Communications, *Plenum Press, Inc.*, 1981, pp. 189–215.

* cited by examiner

Primary Examiner—Stephen M. Baker
(74) Attorney, Agent, or Firm—R. Bruce Brodie

(57) ABSTRACT

A method and means for enhancing the error detection and correction capability obtained when a plurality of data byte strings are encoded in a two-level, block-formatted linear code using code word and block-level redundancy. This is accomplished by vector multiplication of N data byte vectors and a nonsingular invertible integration matrix with nonzero minors with order up to B to secure the necessary interleaving among N data byte vectors to form modified data byte vectors. The selected patterns of interleaving ensure single-pass, two-level linear block error correction coding when the modified data vectors are applied to an ECC encoding arrangement. The method and means are parameterized so as to either extend or reduce the number of bursty codewords or subblocks to which the block-level check bytes can be applied. Lastly, a post-encoding process is provided to "deinterleave" or redistribute the computed codewords into modified codewords such that the data vectors and their codeword check bytes are consistently located in the same codeword with the block-level check bytes are distributed among the first-level codewords.

12 Claims, 10 Drawing Sheets

GENERALIZED INTEGRATED INTERLEAVING ENCODER FOR GENERATING SUFFICIENT REDUNDANCY TO DETECT AND CORRRECT UP TO $(t_1+t_2)$ BYTES FOR EACH OF B BURSTY SUB-BLOCKS

PARTIAL READ AND WRITE PATH DATA FLOW
IN A DIRECT ACCESS STORAGE DEVICE

INTEGRATED INTERLEAVED ENCODER
FOR B=1 BURSTY SUB-BLOCKS

FIG. 3

GENERALIZED INTEGRATED INTERLEAVED (GII) REED SOLOMON ENCODER FOR B=2 BURSTY SUB-BLOCKS

FIG. 4 PARAMETRIC TERMS DEFINING THE GENERALIZED INTEGRATED INTERLEAVED (GII) REED SOLOMON ENCODER

GENERAL NON-SINGULAR EVERY-WHERE INVERTIBLE INTEGRATION MATRIX
HAVING NON-ZERO MINORS OF ORDER UP TO B TO SUPPORT DETECTION
AND CORRECTION OF UP TO B BURSTY SUB-BLOCKS B
WITH UP TO $(t_1 + t_2)$ BYTES IN ERROR

GII DECODER CORRECTING ERROR IN MULTIPLE BURSTY SUB-BLOCKS

METHOD AND APPARATUS FOR EFFICIENT ERROR DETECTION AND CORRECTION IN LONG BYTE STRINGS USING GENERALIZED, INTEGRATED, INTERLEAVED REED-SOLOMON CODEWORDS

CROSS-REFERENCE TO RELATED APPLICATIONS

This application is a continuation-in-part of application Ser. No. 08/971,796, filed Nov. 17, 1997, now U.S. Pat. No. 5,946,328.

FIELD OF THE INVENTION

This invention relates to methods and means for the detection and correction of multibyte errors in long byte strings formatted into a two-level block code structure. Each of the blocks comprises a plurality of subblocks of codewords and their check bytes from a linear error correction code and additional block check bytes derived from some linear attribute taken over all of the codewords. The block-level check bytes can be used to detect and correct errors in codewords when such errors exceed the check byte correction capacity of any single codeword.

DESCRIPTION OF RELATED ART

In the prior art as described in Patel et al., U.S. Pat. No. 4,525,838, "Multiple Byte Error Correcting System Involving a Two-level Code Structure", there is disclosed an apparatus for detecting and correcting multiple bytes in error in long byte strings read back from a magnetic disk storage subsystem or the like. Prior to recording the byte strings on magnetic disk, the data bytes are formatted into a two-level block/subblock code structure. Thus, equal-length data words are mapped into codewords from a linear error correction code such as a Reed-Solomon (RS) code. A fixed number of these codewords, including their check bytes, are byte interleaved to form a subblock. In turn, a given number of subblocks are concatenated and check bytes taken over all of the subblocks are appended thereto to form a block.

In Patel, each subblock comprises at least two byte interleaved message words and check bytes. In order to correct $t_1$ errors in a codeword, $2t_1$ check bytes must be calculated from the message word and appended to form the codeword. This means that each subblock can correct up to $t_1$ bytes in error. Also, each block consists of a predetermined number of subblocks and block check bytes. In this regard, the block check bytes are computed over all of the subblocks as a modulo 2 accumulation as specified by a pair of modulo 2 matrix equations. Thus, Patel does not use the same code process for generating the codewords and check bytes at the subblock level as is used to derive the block-level check bytes. This presents recovery difficulty if the block-level check bytes are themselves subject to error or erasure.

In Cox et al., copending application Ser. No. 08/971,798, filed Nov. 17, 1997, "Method and Means For Efficient Error Detection and Correction in Long Byte Strings Using Integrated Interleaved Reed-Solomon Codewords", there is disclosed a method and means for enhancing error detection and correction capability obtained when equal-length data byte strings are encoded in a two-level block format. That is, data bytes are encoded into codewords of a linear block code. The codewords are then interleaved and mapped into a block codeword with additional redundancy. The advance in this case is realized by using the same coding regime for both levels of derived redundancy bytes. This is achieved by forming a logically combined datastring from copies of the (n−1) other datastrings and applying the combined string and the (n−1) other strings as input to a counterpart set of RS encoders and logically combining the encoded outputs and concatenating with the (n−1) other outputs. On readback from the disk, the codewords of a block and their logical sum are syndrome processed to resolve any identified errors within the correction capability of any single word. The syndrome processing also resolves any errors within the correction capability of any single word and block-level redundancy. Lastly, the syndrome processing provides signal indication when the correction capacity has been exceeded.

A number of scientific groups concerned with magnetic recording limits (the so-called superparamagnetic limit) are of the opinion that bits are going to disappear. What this means is that over time the recording size of bits in relationship to recording densities will become even more infinitesimal. One consequence is that random thermal motion at the molecular/atomic level will be sufficient to change or alter bits.

Currently, the worst bit error rate for disk recording is in the range of one error bit of $10^6$ bits stored. This is expressed as a bit error rate of $10^{-6}$. The actual range lies between $10^{-9}$ and $10^{-6}$ with the latter representing the worst case. As may be recalled, when ECC and especially RS codewords are recorded, the RS decoder located in the DASD readback channel converts a nominal bit error rate from $10^{-6}$ to $10^{-13}$.

Presently, magnetic disk recording of data uses a short sector format (512 bytes per sector) and requires an ECC redundancy of 4–5 percent. It is known from Shannon's Information Theory that block error correcting codes such as RS codewords that are very long are more communications efficient in that the percentage of ECC redundancy for a prescribed reliable error rate is reduced. However, the longer codewords increased the complexity of RS decoders. It is proposed to use a longer sector format in the order of 4096 bytes to reduce the ECC redundancy percentage.

The copending Cox application discloses the use of three-way interleaving on short sector formatted data (512 bytes/sector). In this case, a block-level check was obtained from the XORing of the three subblocks prior to first-level encoding. When the codeword or subblock error exceeds the subblock correction capacity, the Cox configuration is limited in that the block-level redundancy can only correct a single subblock badly in error (a so-called "bursty" subblock).

In this specification, the terms "subblock" and "codeword" are used synonymously. Also, the term "byte" of eight binary bits is used as a quantitative measure of data and information as a convenience. Any other measure, such as a "nibble" or "word", if used consistently, would also operate as a quantitative measure.

Also in this specification, the term "bursty subblock" should be defined as any subblock or codeword subject to bytes in error exceeding its $t_1$ codeword correction capacity for any given two-level linear block error correction coding process.

SUMMARY OF THE INVENTION

It is an object of this invention to devise a method and means for enhancing the error detection and correction capability obtained when a plurality of data byte strings or vectors are interleaved and encoded in a two-level, block-formatted linear code using codeword (subblock) and block-level redundancy.

It is another object of this invention to devise a method and means for extending the number of interleaved sub-blocks and the number of correctable bursty subblocks in a method and means for detecting and correcting error in a two-level, block-formatted linear code using codeword (subblock) and block-level redundancy.

It is a more particular object to devise a method and means for enhancing a set of equal-length data byte messages formatted as a sector or a track, modifying them by way of logically combining and interleaving them, mapping them into ECC codewords, and modifying the ECC codewords by performing inverse logical operations thereon prior to storing or communicating them.

It is yet another particular object to devise a method and means responsive to possible noise-encrusted codewords of a two-level, block-formatted linear code and received from a communications path or read back from a storage sub-system for flexibly utilizing block-level redundancy in the detection and correction of error among multiple bursty codewords.

It was unexpectedly observed that an N×N sized matrix having nonzero minors with orders up to B could be used to secure the necessary integration interleaving among N data byte vectors to form modified data byte vectors. There are several purposes to be served by the interleaving method and pattern. First, selected patterns of interleaving ensure single-pass, two-level linear block error correction coding when the modified data vectors are applied to an ECC encoding arrangement. Second, the method and means are parameter-ized so as to either extend or reduce the number of bursty codewords or subblocks to which the block-level check bytes can be applied. Third, a post-encoding process is provided to "deinterleave" or redistribute the computed codewords into modified codewords such that the data vectors and their codeword check bytes are in the same code and the block-level check bytes are distributed among the first-level codewords.

More particularly, the above objects are believed satisfied by a method for detecting and correcting multibyte errors in long byte strings either derived from a communications system or recorded on a moving storage medium of a storage device in blocks. Relatedly, each block comprises a plurality of codewords and a plurality of block-level check bytes derived from the codewords. Also, each codeword includes data bytes and codeword check bytes mapped from a plurality of extrinsic data byte vectors according to a linear error correction code.

The method of the invention involves generating and either transmitting on the communications system or recording on the storage medium at least one block formed from N codewords. The codeword generation includes creating a set of $B \leq N$ data byte vectors m' as an interleave of N linearly combined, extrinsically supplied data byte vectors m. The interleave is attained by linearly combining the N data byte vectors m using a B×B matrix of constant finite field multipliers which form an invertible integration matrix. The set of $B \leq N$ modified data byte vectors m' is mapped into a counterpart set of $B \leq N$ codewords c' of an appropriate linear error correction code, e.g., Reed-Solomon code. The codewords c' include $2t_1$ check bytes per codeword and $B*(2t_2)$ block-level check bytes. The last step of code generation is that of creating a set of $B \leq N$ modified codewords c from said set of $B \leq N$ codewords c' by matrix multiplication of the B codewords c' by the inverse of B×B subarray and writing them to storage.

When blocks are read back from a storage medium such as magnetic or optical disk or from a communications channel and after the signals are detected, each accessed block is processed to detect and correct incipient bytes in error. Such decoding includes deriving syndromes from the check bytes therein, and identifying any nonzero syndromes. It then involves processing any identified nonzero syndromes over the codewords to correct any bytes in error using the $2t_1$ check bytes per codeword. Relatedly, any block-level nonzero syndromes are processed either to locate and correct $(t_1+t_2)$ bytes in error in up to B bursty single codewords exceeding the correction capability of the respective codeword but within the capability of the block, or to indicate that the bytes in error exceed the correction capability of both the codeword and block levels.

DESCRIPTION OF THE PREFERRED EMBODIMENT

The description and understanding of the preferred embodiment is believed assisted by making reference to the pertinent portions of copending application Ser. No. 08/971,796, filed Nov. 17, 1997. The discussion is initiated by making reference to the read and write path signal processing accordingly in a high-density magnetic disk drive. This is followed by a discussion of integrated, interleaved, two-level ECC encoding and decoding used to flexibly increase the number of errors resolvable in one subblock where the number of errors exceeds its correction capacity. Next, the method and means of this invention are set out in which ECC encoding and decoding can be flexibly extended to resolve errors in two bursty subblocks. Then, the generalized, integrated, interleaved ECC encoding and decoding for more than two bursty subblocks or codewords is described according to the invention. Lastly, a brief encoding and decoding example illustrates the principles of the invention.

Magnetic Disk Drive Read and Write Path Information Processing Dynamics

Figure 1:
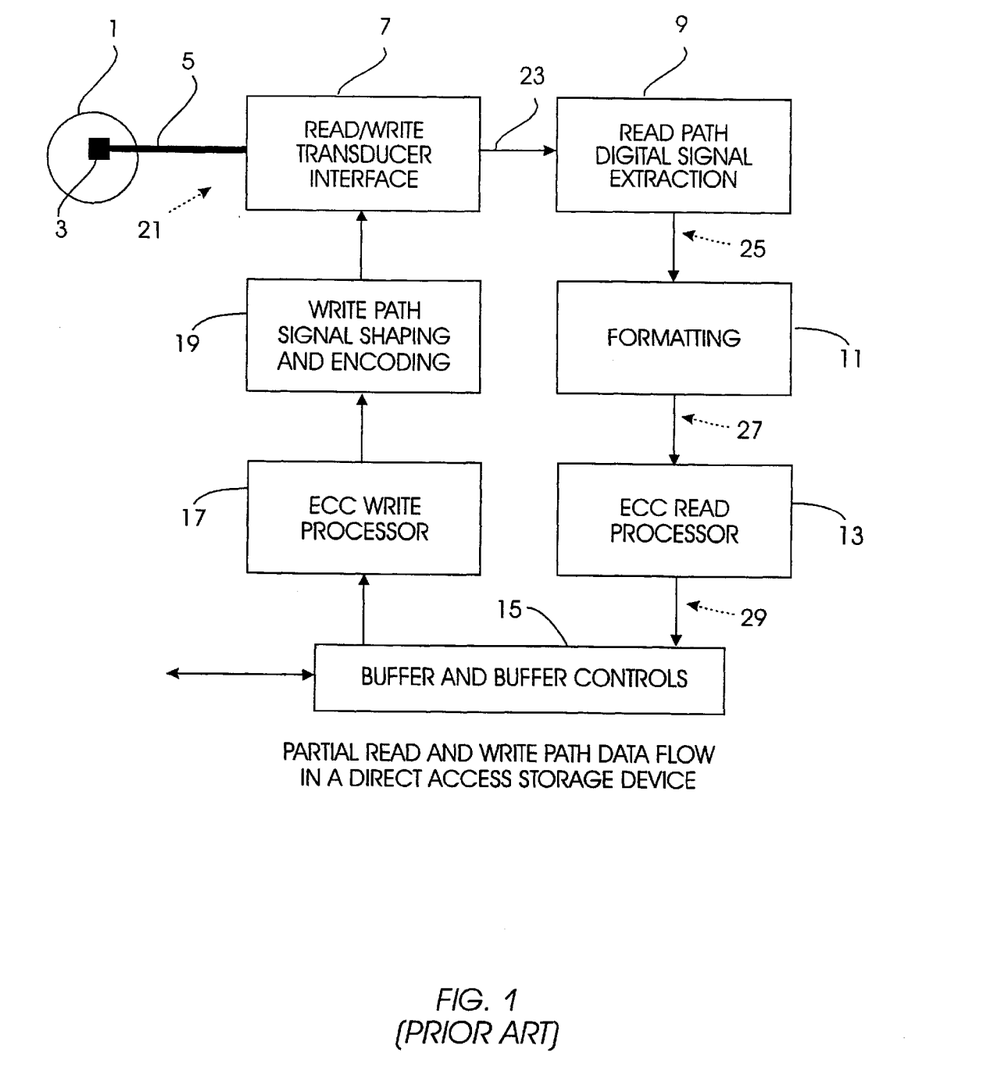
FIG. 1 depicts a prior art partial data flow in the write and read paths of a disk drive for an on-the-fly calculation and appending of check bytes to form and record linear ECC codewords and the detection and correction of linear ECC codewords read from the disk tracks.

Referring now to FIG. 1, there is shown a partial logical view of a disk drive and a portion of the read and write paths according to the prior art. A disk drive, also termed a direct access storage device, comprises a cyclically rotated magnetic disk 1, a radial or axially movable access arm 5 tipped with an electromagnetic transducer 3 for either recording magnetic flux patterns representing sequences of digital binary codewords along any one of a predetermined number of concentric tracks on the disk, or reading the recorded flux patterns from a selected one of the tracks and converting them into codewords.

When sequences of digital binary data are to be written out to the disk 1, they are placed temporarily in a buffer 15 and subsequently processed and transduced along a write path or channel (17, 19, 7, 5, 3) having several stages. First, a predetermined number of binary data elements, also termed bytes, in a datastring are moved from the buffer and streamed through the ECC write processor 17. In processor 17, the data bytes are mapped into codewords drawn from a suitable linear block or cyclic code, such as a Reed-Solomon code. This is well appreciated in the prior art. Next, each codeword is mapped in the write path signal-shaping unit 19 into a run-length-limited or other bandpass or spectral-shaping code and changed into a time-varying signal. The time-varying signal is applied through an interface 7 and thence to the write element in a magnetoresistive or other suitable transducer 3 for conversion into magnetic flux patterns.

All of the measures starting from the movement of the binary data elements from buffer 15 until the magnetic flux patterns are written on a selected disk track as the rotating disk 1 passes under the head 3 are synchronous and streamed. For purposes of efficient data transfer, the data is destaged (written out) or staged (read) a disk sector at a time. Thus, both the mapping of binary data into Reed-Solomon codewords and the conversion to flux-producing, time-varying signals must be done well within the time interval defining a unit of recording track length moving under the transducer. Typical units of recording track length are equal fixed-length byte sectors of 512 bytes.

When sequences of magnetic flux patterns are to be read from the disk 1, they are processed in a separate so-called read path or channel (7, 9, 11, 13) and written into buffer 15. The time-varying signals sensed by transducer 3 are passed through the interface 7 to a signal extraction unit 9. Here, the signal is detected and a decision made as to whether it should be resolved as a binary 1 or 0. As these 1's and 0's stream out of the signal extraction unit 9, they are arranged into codewords in the formatting unit 11.

Since the read path is evaluating sequences of RS codewords previously recorded on disk 1, then, absent error or erasure, the codewords should be the same. In order to test whether that is the case, each codeword is applied to the ECC read processor 13 over a path 27 from the formatter.

Also, the sanitized output from the ECC processor 13 is written into buffer 15 over path 29. The read path must also operate in a synchronous datastreaming manner such that any detected errors must be located and corrected within the codeword well in time for the ECC read processor 13 to receive the next codeword read from the disk track. The buffer 15 and the read and write paths may be monitored and controlled by a microprocessor (not shown) to ensure efficacy where patterns of referencing may dictate that a path not be taken down such as sequential read referencing.

Integrated, Interleaved ECC Coding for B=1 Bursty Codewords

Figure 2:
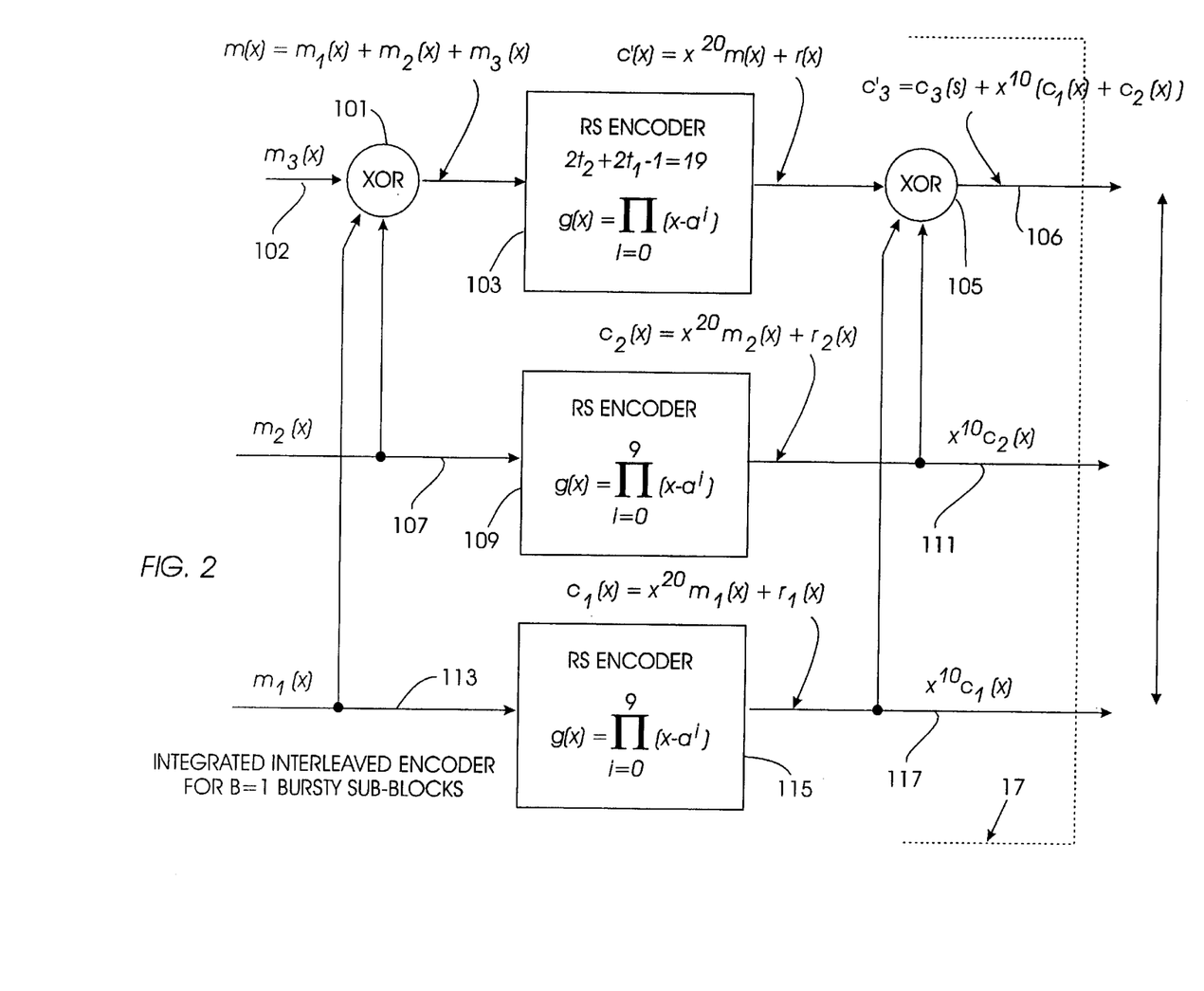
FIG. 2 shows a high-level logic flow forming an integrated interleaved datastream in the DASD write path of linear ECC codewords with enhanced detection and correction capability according to the method and means described in copending application Ser. No. 08/971,796, filed Nov. 17, 1997.

Referring now to FIG. 2, there is shown a high-level logic flow 17 of an ECC encoder for providing enhanced detection and correction capability as described in the copending Cox application.

Referring now to FIG. 2, there is shown an ECC write processor 17 modified, however, to illustrate the principles of the invention. The ECC processor in FIG. 2 comprises three Reed-Solomon encoders 103, 109, and 115. For purposes of illustration, the parameters $2t_1$ and $2t_2$ will be set equal to 10. The encoders are each defined by their generating polynomial g(x). In this regard, encoders 115 and 109 have the same polynomial, namely $$g(x) = \prod_{i=0}^{2t_1-1=9} (x-a^i).$$

Encoder 103 is governed by the polynomial $$g(x) = \prod_{i=0}^{2t_1+2t_2-1=19} (x-a^i).$$

As previously discussed, the RS encoding action consists of creating a codeword $$c_j(x) = x^{2t_1} m_j(x) + r_j(x).$$

In this regard, r(x) is obtained by dividing a copy of a data byte stream $m_j(x)$ by the generating function g(x) and appending the remainder $r_j(x)$. The codeword outputs from encoders 115, 109, and 103 are respectively designated $c_1(x)$, $c_2(x)$, and c'(x). In this embodiment, three equal-length data byte strings $m_1(x)$, $m_2(x)$, and $m_3(x)$ are concurrently applied on respective paths 113, 107, and 102 a byte at a time. That is, $m(x) = m_1(x) \oplus m_2(x) \oplus m_3(x)$. In order to secure equal-length codewords, the two datastreams $m_1(x)$ and $m_2(x)$ need to have appended to each of them $2t_2=10$ zeroes, as denoted by $\phi(x)$, prior to their encoding, since the encoders 115 and 109 append $2t_1=10$ checks to $m_1(x)$ and $m_2(x)$. Then the resulting codewords are expressed as:

$$c_1(x) = x^{20} m_1(x) + r_1(x)$$

$$c_2(x) = x^{20} m_2(x) + r_2(x).$$

Encoder 103 encodes the logical sum m(x) where $$m(x) = m_1(x) \oplus m_2(x) \oplus m_3(x).$$

This encoder appends to it $2t_1+2t_2=20$ checks, resulting in an intermediate expression $c'(x) = x^{20} m(x) + r(x)$. The codeword $c_3(x)$ is obtained as the logical sum of XOR gate 105 and is expressed as:

$$c_3(x) = c'(x) \oplus c_1(x) \oplus c_2(x) = x^{20} [m_3(x) + r_B(x) + r_3(x)].$$

The check bytes $r_B(x)$ are the block checks shared by $m_1(x)$, $m_2(x)$, and $m_3(x)$, whereas $r_3(x)$ are the individual check bytes of datastream $m_3(x)$.

Structurally, each of the input paths 113, 107, and 102 is also terminated in an XOR gate 101. This provides an input $m(x)$ to the RS encoder 103 where $m(x)$ is the binary sum modulo 2 of all three byte strings $m_1(x)$, $m_2(x)$, and $m_3(x)$. That is, $m(x)=(m_1(x)+m_2(x)+m_3(x))$ modulo 2. As a consequence of the operations performed within the encoder 103, the string $m(x)$ is shifted $2t_2=20$ positions or $x^{20}m(x)$ and a remainder $r(x)$ is formed. Thus, $$c'(x)=x^{2t_1+2t_2}m(x)+r(x).$$

Generically, the concurrent output $c_2(x)$ and $c_1(x)$ from encoders 109 and 115 are respectively:

$$c_2(x)=x^{20}m_2(x)+r_2(x)$$
$$c_1(x)=x^{20}m_1(x)+r_1(x).$$

Imposing on the encoder outputs the dual of the XOR input operation, and copies of the encoder outputs $c_1(x)$ and $c_2(x)$ are applied to a second XOR gate 105. The output of the second XOR gate 105 is designated as $c_3(x)$ and may be expressed as:

$$c_3(x)=c'(x)+[c_1(x)+c_2(x)].$$

Figure 7:
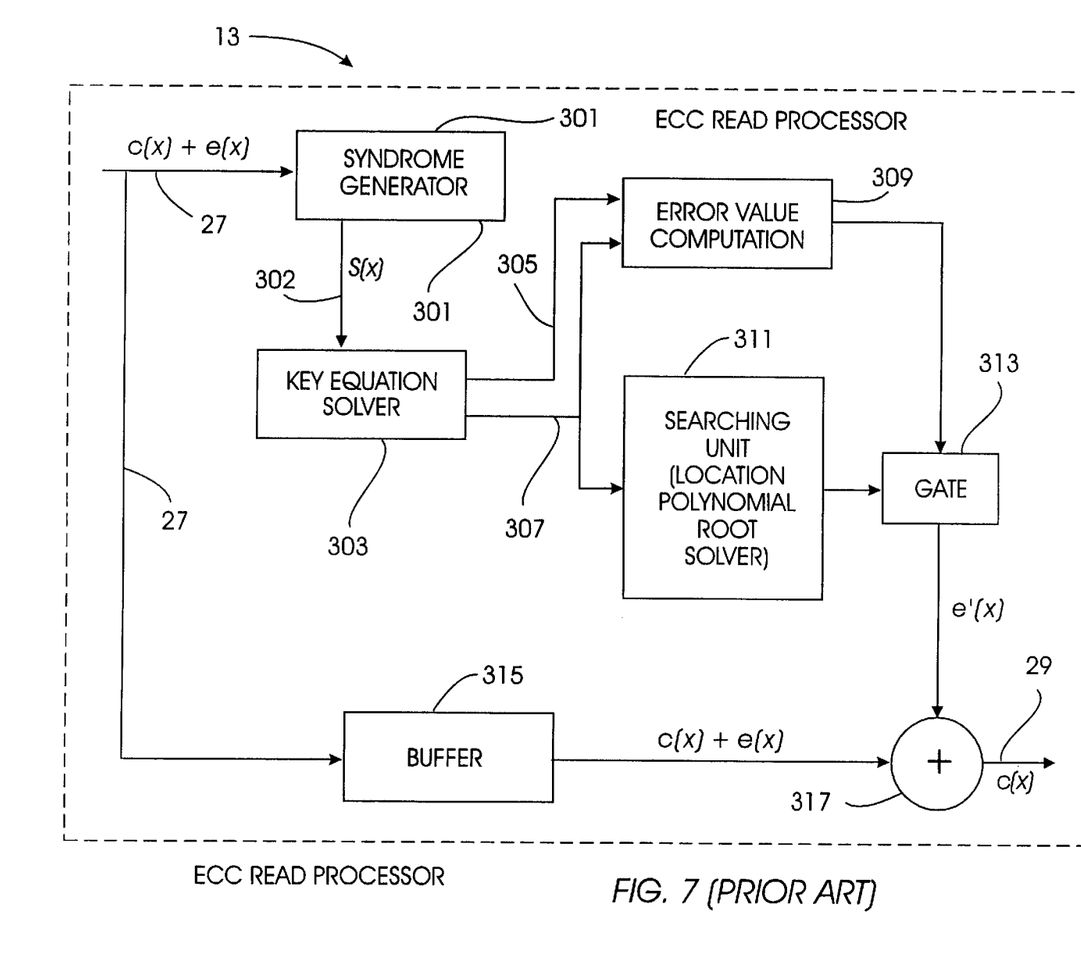
FIG. 7 shows the detection and correction of linear ECC codewords in the read path of a disk drive or DASD utilizing on-the-fly calculation of syndromes and the location and value of any errors derived from the syndromes to enable correction also as appreciated in the prior art.

In the prior art Reed-Solomon decoder of FIG. 7, there is respectively set out a portion of the ECC processor 13 in the DASD read path relating to detecting and correcting errors in received codewords according to the prior art. In this embodiment, each received codeword $c(x)+e(x)$ is simultaneously applied over input path 27 to syndrome generator 301 and buffer 315. Here, each received word logically consists of the codeword $c(x)$ plus an error component $e(x)$. If $e(x)=0$, then the codeword $c(x)$ is valid.

Detection and Correction of Corrupted Readback ECC Codewords in the Prior Art In FIG. 7, the purpose of the internal buffer 315 is to ensure that a time-coincident copy of the codeword $c''(x)$ is available for modification as the codeword leaves the unit on path 29 for placement in the DASD buffer 15 as shown in FIG. 1. The detection of error is provided by the syndrome generator 301. The polynomials constituting the error value and error locations inputs are derived from the syndromes by the key equation solver 303. Next, an error value computation unit 309 and a root solver 311 determine the error values and their locations within the received codeword, respectively. The outputs of the error value computation and the root locations (location within the codeword of the detected errors) are jointly applied through a gate 313 and logically combined with a time-delayed version of $c(x)+e(x)$ at an XOR gate 317.

In general, the process represented by the ECC read processor embodiment is an example of time-domain decoding and is well appreciated in the prior art. Attention is directed to Hassner et al., U.S. Pat. No. 5,428,628, "Modular Implementation for a Parallelized Key Equation Solver for Linear Algebraic Codes", issued Jun. 27, 1995. Hassner describes designs for respective syndrome detection, key equation solving, error value computation, and most significantly for error location. See also Clark et al., "Error Correction Coding for Digital Communications", *Plenum Press, Inc.*, 1981, pp. 189–215.

Figure 8:
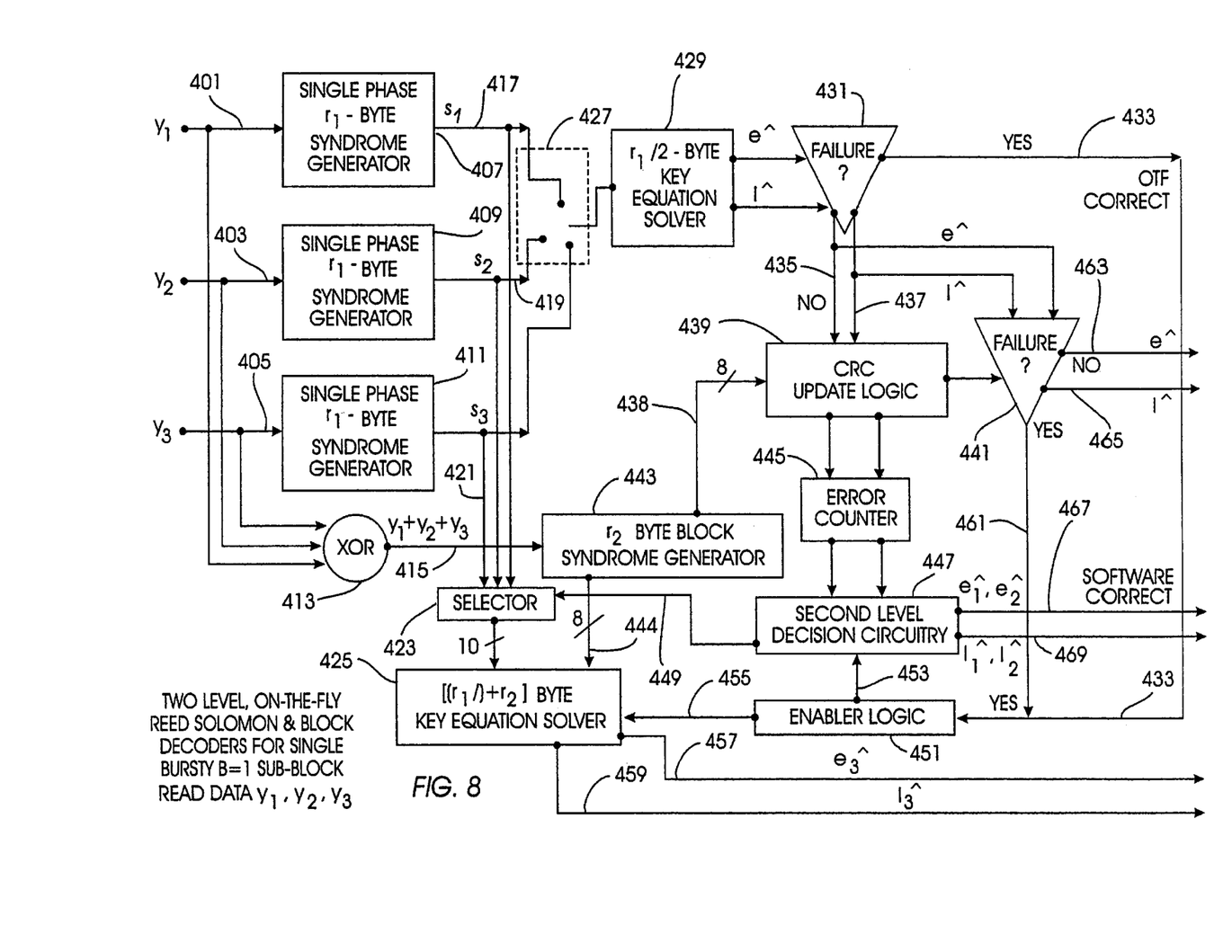
FIG. 8 illustrates a two-level, on-the-fly, Reed-Solomon block decoder for processing a single bursty B=1 subblock.

Detection and Correction of Corrupted Two-level Linear ECC Codewords for Single Bursty Subblock or Codeword Referring now to FIG. 8, there is shown a two-level, on-the-fly RS subblock and block decoder capable of resolving up to $t_1+t_2$ bytes in error for a single bursty (B=1) subblock. There is depicted a decoder arrangement for generating error and location values from syndromes detected in any of the codewords forming the interleaved words in a block according to the invention. Prior to processing blocks in ECC read processor 13, they must first be read back from disk 1 and "demultiplexed" in formatter 11 as set out in the read path data flow in FIG. 1. This will separate out the data byte strings, the block checks, and the codeword check bytes so that they can be validity tested.

The decoder arrangement (ECC read processor 13) comprises three byte syndrome generators 407, 409, and 411 for ascertaining the syndrome set $s_1$, $s_2$, $s_3$ over the received codewords $y_1$, $y_2$, and $y_3$ as applied on paths 401, 403, and 405. Concurrently, a modulo 2 sum of $y_1$, $y_2$, and $y_3$ is derived from XOR gate 413 and applied to a block syndrome generator 443 over path 415. In turn, the syndromes derived from the codewords are applied to a Reed-Solomon (RS) decoder 429 over switch 427. The syndromes derived over all the codewords and block checks are applied to another RS decoder 425. This represents a significantly enhanced Reed-Solomon encoding of data capable of detecting and correcting more errors.

In this embodiment, RS decoder 429 processes the nonzero syndrome output from any one of the selected generators 407, 409, and 411. It has the capacity to correct up to $r_1/2=t_1$ bytes in error in any single codeword. Concurrently, generator 443 produces any nonzero syndromes based on the $r_2$ check bytes in the block derived from the modulo 2 sum of the received codewords $y_1$, $y_2$, and $y_3$ through XOR gate 413. CRC update logic 439 matches whether the same bytes are in error. If so, the correction computed by RS decoder 429 is deemed correct. If the bytes in error mismatch, then the $r_1$ syndromes in the phase that fails and $r_2$ block syndromes are applied respectively through selector 423 and generator 443 to RS decoder 425. That is, a mismatch as indicated by CRC logic 439 will be reported via failure circuit 441 and activate enabler logic 451 over path 461. Enabler logic 451 activates RS decoder 425 to effectuate a correction of up to $(r_1+r_2)/2$ bytes in error.

More particularly, a copy of the $r_2$ syndromes from generator 443 is operative as cyclic redundancy check characters (CRCs). The CRCs are used to check the on-the-fly correction of RS decoder 429. That is, the CRCs are used by logic 439 to calculate the error values and locations in the received codeword y. If they differ, then RS decoder 425 resolves error in codeword y using both the $r_1$ and $r_2$ syndromes. Such difference would occur, for example, if any of the $r_1$ check bytes would be in error or where the number of bytes in error were greater than the correction capability of RS decoder 429. In the rare circumstance where the number of errors exceeded the capability of RS decoder 425, i.e., $(r_1+r_2)/2$ errors, then signal indication of the noncorrectability must be provided to the drive controller (not shown).

Parenthetically, implementation of a Reed-Solomon decoder is a matter of design choice. In this regard, since the codeword rate is higher than the block rate, an on-the-fly hardware implementation would be appropriate. However, where the error patterns exceed the correction capability of the first level RS decoder 429, they present a range of correction choices more complicated since they may involve a higher level of correction. In these circumstances, a software RS decoder implementation on a dedicated microprocessor offers the flexibility necessary in analyzing and correcting complex error patterns.

Figure 3:
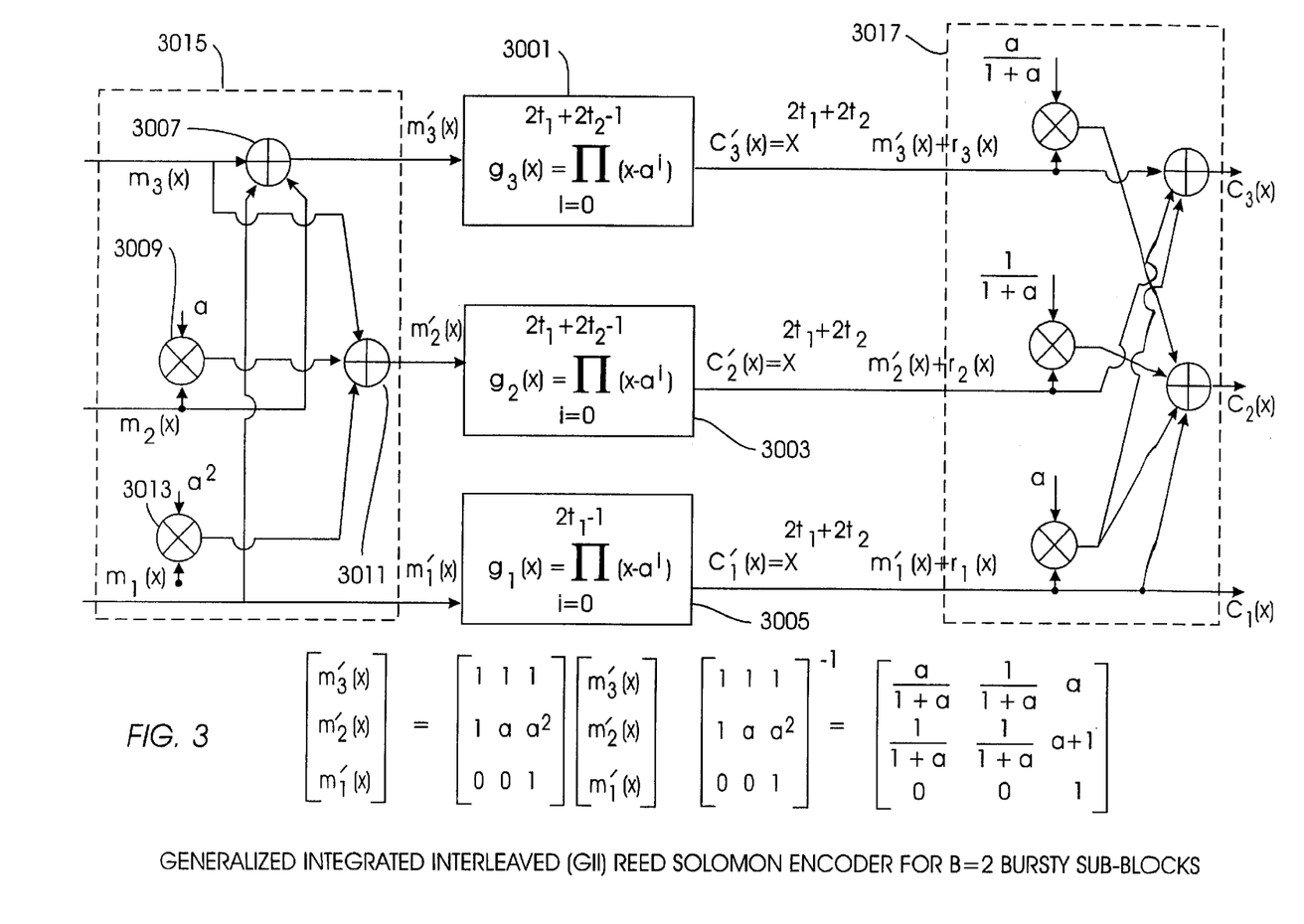
FIG. 3 sets forth a high-level logic flow for forming a generalized, integrated, interleaved (GII) Reed-Solomon encoder for introducing sufficient redundancy in the datastream to detect and correct error for B=2 bursty subblocks according to the invention.

Integrated, Interleaved, Two-level Block ECC Encoding for B=2 Bursty Subblocks or Codewords Referring now to FIG. 3, there is shown a high-level logic flow for forming a generalized, integrated, interleaved (GII)

Reed-Solomon encoder for introducing sufficient redundancy in the datastream to detect and correct error for B=2 bursty subblocks according to the invention. Respective datawords $m_1(x)$, $m_2(x)$, and $m_3(x)$ of predetermined byte length are applied to respective inputs of constant multiplier matrix 3015. This matrix multiplier together with its inverse matrix multiplier 3017 represents the major logic modification over the embodiment shown in FIG. 2.

In this regard, matrix multiplier 3015 represents a 3×3 sized nonsingular matrix with nonzero minors with orders up to 2 for interleaving the three data byte vectors $m_1(x)$, $m_2(x)$, and $m_3(x)$ to form modified data byte vectors $m_1'(x)$, $m_2'(x)$, and $m_3'(x)$. As previously mentioned, there are several purposes to be served by the interleaving method and pattern. First, selected patterns of interleaving ensure single-pass, two-level linear block error correction coding when the modified data vectors are applied to an ECC encoding arrangement. Second, the method and means are parameterized so as to either extend or reduce the number of bursty codewords or subblocks to which the block-level check bytes can be applied. Third, a post-encoding process is provided to "deinterleave" or redistribute the computed codewords into modified codewords such that the data vectors and their codeword check bytes are in the same codeword and the block-level check bytes are distributed among the codewords.

The matrix multiplier 3015, as represented by logic gates 3007, 3009, 3013, and 3011, relate the modified data byte vectors m' to the inputs m in the following linear or matrix algebraic form:

$$\begin{bmatrix} m_3'(x) \\ m_2'(x) \\ m_1'(x) \end{bmatrix} = \begin{bmatrix} 1 & 1 & 1 \\ 1 & a & a^2 \\ 0 & 0 & 1 \end{bmatrix} \begin{bmatrix} m_3(x) \\ m_2(x) \\ m_1(x) \end{bmatrix}$$

such that:

$m_3'(x) = m_1(x) \oplus m_2(x) \oplus m_3(x)$ $m_2'(x) = a^2 m_1(x) \oplus a m_2(x) \oplus m_3(x)$ $m_1'(x) = m_1(x)$ where the invertible submatrix is expressed as:

$$\begin{bmatrix} 1 & 1 & 1 \\ 1 & a & a^2 \\ 0 & 0 & 1 \end{bmatrix}$$

and its inverse as:

$$\begin{bmatrix} 1 & 1 & 1 \\ 1 & a & a^2 \\ 0 & 0 & 1 \end{bmatrix}^{-1} = \begin{bmatrix} \frac{1}{1+a} & \frac{1}{1+a} & a \\ \frac{1}{1+a} & \frac{1}{1+a} & a+1 \\ 0 & 0 & 1 \end{bmatrix}$$

The modified data byte vectors m' represent an interleaving of the original data vectors to assure that any redundancy or check byte calculations can be defined over both the codeword (subblock) and block levels. Relatedly, the modified data byte vectors are applied over corresponding paths to linear ECC encoders 3001, 3003, and 3005 of the Reed-Solomon type. In this regard, the codeword generating polynomial $g(x) = \{g_3(x), g_2(x), \text{ and } g_1(x)\}$ in the respective encoders 3001, 3003, 3005 is set out in standard product form such that:

$$g_3(x) = \prod_{i=0}^{2t_1 + 2t_2 - 1} (x - a^i).$$

$$g_2(x) = \prod_{i=0}^{2t_1 + 2t_2 - 1} (x - a^i).$$

$$g_1(x) = \prod_{i=0}^{2t_1 - 1} (x - a^i).$$

The encoders compute the check bytes at both the codeword and block levels. The results of the encoding operations are expressed by codewords $c_1'(x)$, $c_2'(x)$, and $c_3'(x)$ where:

$c_3'(x) = x^{20}[m_3(x) \oplus m_2(x) \oplus m_1(x)] + r_3'(x)$ $c_2'(x) = x^{20}[m_3(x) \oplus a \cdot m_2(x) \oplus a^2 \cdot m_1(x)] \oplus r_2'(x)$ $c_1'(x) = x^{20} m_1(x) \oplus r_1(x)$ As mentioned several times previously, the post-encoding process is provided to "deinterleave" or redistribute the computed codewords into modified codewords such that the data vectors and their codeword check bytes are in the same codeword and the block-level check bytes are distributed among the codewords. This means that the codewords $c_1'(x)$, $c_2'(x)$ and $c_3'(x)$ are applied to a second matrix multiplier 3017. This logic actually multiplies the codewords c'(x) by the inverse of the integrating or interleaving matrix to create modified code words c(x) whereby:

$$\begin{bmatrix} c_3(x) \\ c_2(x) \\ c_3(x) \end{bmatrix} = \begin{bmatrix} 1 & 1 & 1 \\ 1 & a & a^2 \\ 0 & 0 & 1 \end{bmatrix}^{-1} \cdot \begin{bmatrix} c_3'(x) \\ c_2'(x) \\ c_1'(x) \end{bmatrix} = \begin{bmatrix} \frac{1}{1+a} & \frac{1}{1+a} & a \\ \frac{1}{1+a} & \frac{1}{1+a} & a+1 \\ 0 & 0 & 1 \end{bmatrix} \cdot \begin{bmatrix} c_3'(x) \\ c_2'(x) \\ c_1'(x) \end{bmatrix}$$

This results in a redistribution of data vectors m(x) and of the codeword and block-level check bytes formatted as follows:

$c_3(x) \rightarrow |m_3(x)|r_{B_1}(x)|r_3(x)|$ $c_2(x) \rightarrow |m_2(x)|r_{B_2}(x)|r_2(x)|$ $c_3(x) \rightarrow |m_1(x)|0|r_1(x)|$ where $r_B$ and $r_i$ represent the block-level and codeword-level check bytes, respectively.

Figure 4:
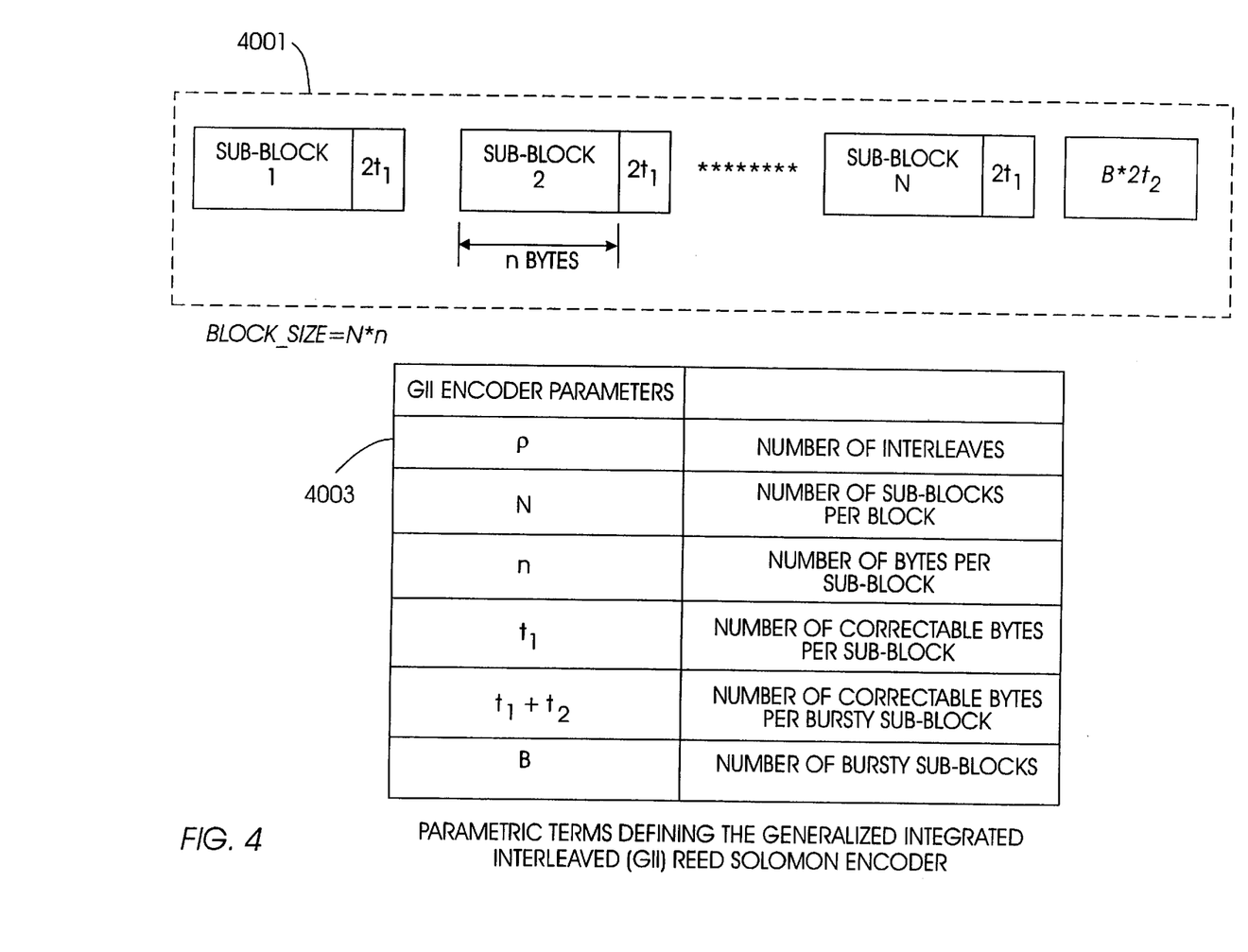
FIG. 4 sets out general block and subblock organization together with a definition of related parameters pertinent to the invention.

Block Organization and Parameters for a Block of Up to N Subblocks and B≦N Bursty Subblock Correction Referring now to FIG. 4, there is shown a general block and subblock organization 4001 together with a definition of related parameters 4003 pertinent to the invention. Conceptually, each block comprises N subblocks of n bytes per subblock. Appending each data vector in a codeword or subblock are $2t_1$ check bytes defined over the data vector according to a Reed-Solomon (RS) or other linear block or cyclic error correction code. Additionally, the block includes $B*2t_2$ check bytes where B is the number of correctable bursty codewords. The parameters utilized to dimension and control the generalized, integrated, interleaved (GII) coding process are reproduced in the table below and in FIG. 4.

| GII ENCODER PARAMETERS | |
|---|---|
| ρ | number of interleaves |
| N | number of subblocks per block |
| n | number of bytes per subblock |
| $t_1$ | number of correctable bytes per subblock |
| $t_1 + t_2$ | number of correctable bytes per bursty subblock |
| B | number of bursty subblocks |

Referring now to FIG. 2, there is shown a GII having an interleave parameter ρ=3 subblock, B=1 bursty subblock correction capability, a subblock correction capability of $t_1$=5 bytes/codeword, and a burst correction capability of $t_1$+t2=10 bytes. For any three subblocks having bytes in error respectively of $T_1$, $T_2$, and $T_3$, a system of this type will correct all combinations of values of $\{T_1, T_2, T_3\}$ that satisfy the following inequalities:

$$T_1+T_3 \leq 10$$

$$T_1+T_2 \leq 10$$

The correctable error patterns are tabulated but they are sensitive to distribution:

| $T_1$ Correctable Bytes in Error | $T_2$ | $T_3$ | Total Correctable Errors |
|---|---|---|---|
| 10 | 0 | 0 | 10 |
| 9 | 1 | 1 | 11 |
| 8 | 2 | 2 | 12 |
| 7 | 3 | 3 | 13 |
| 6 | 4 | 4 | 14 |
| 5 | 5 | 5 | 15 |

For the system shown in FIG. 3, there is shown a GII having an interleave parameter ρ=3 subblock, B=2 bursty subblock correction capability, a subblock correction capability of $t_1$5 =bytes/codeword, and a burst correction capability of $t_1+t_2$=10 bytes. For any three subblocks, the maximum number of correctable bytes in error denoted by $T_1$, $T_2$, and $T_3$, a system of this type will correct all combinations of error $\{T_1, T_2, T_3\}$ satisfying the inequalities:

$$T_1+T_3 \leq 10$$

$$T_2+T_2 \leq 10$$

The correctable error patterns are tabulated as follows:

| $T_1$ Correctable Bytes in Error | $T_2$ | $T_3$ | Total Correctable Errors |
|---|---|---|---|
| 10 | 10 | 0 | 20 |
| 9 | 9 | 1 | 19 |
| 8 | 8 | 2 | 18 |
| 7 | 7 | 3 | 17 |
| 6 | 6 | 4 | 16 |
| 5 | 5 | 5 | 15 |

Figure 5:
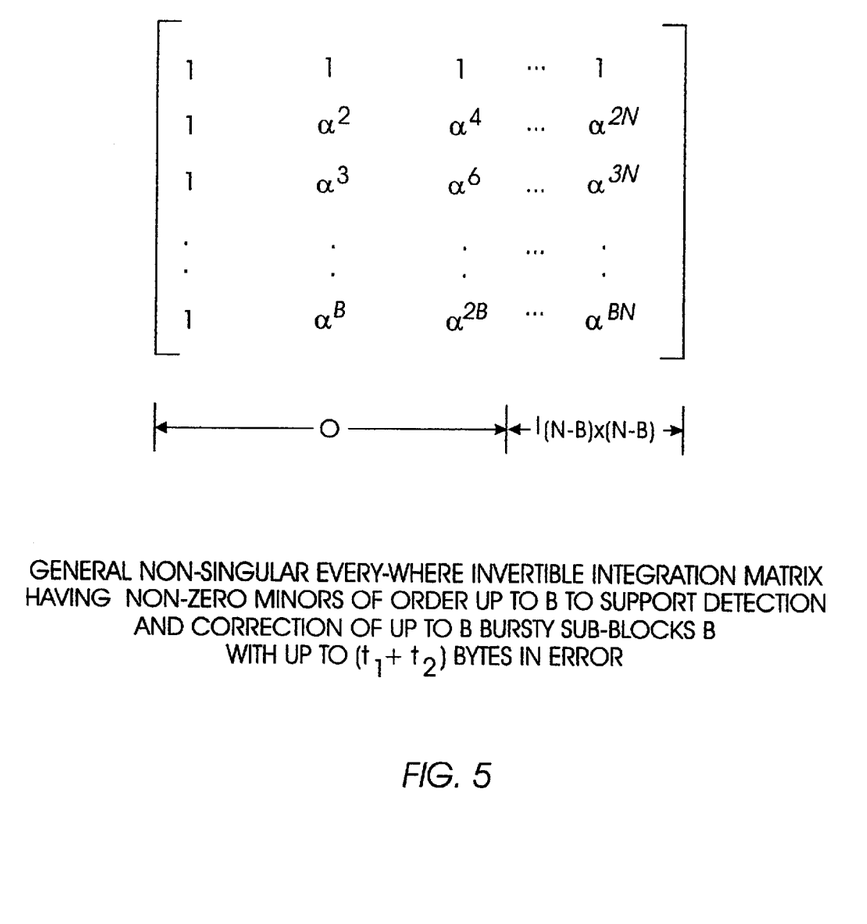
FIG. 5 illustrates a general, nonsingular, integration matrix having nonzero minors with order up to B to support detection and correction of up to B bursty subblocks.
Figure 6:
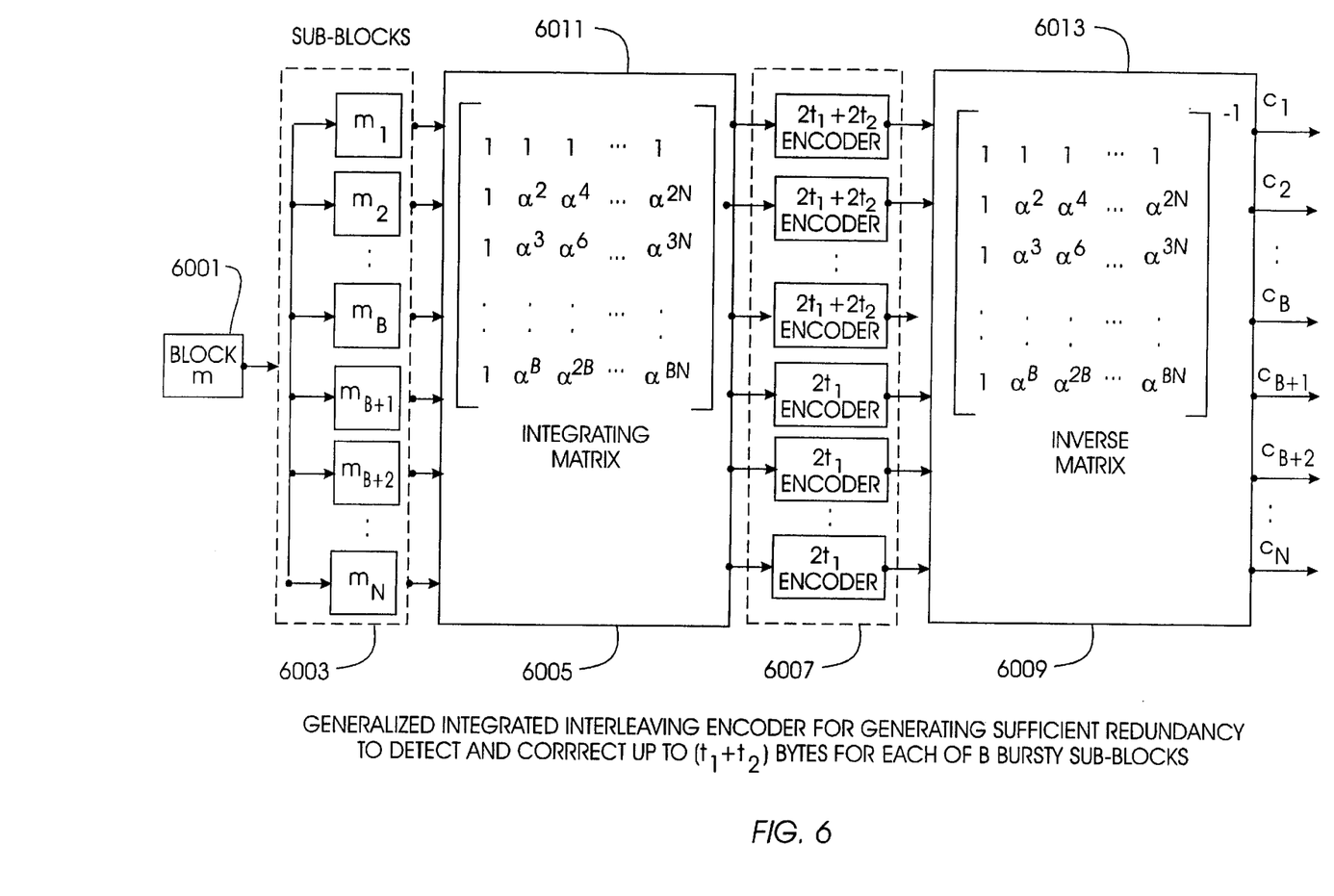
FIG. 6 depicts the generalized, integrated, interleaving encoder having an integrating matrix and its inverse as shown in FIG. 5 for generating sufficient redundancy to detect and correct up to $(t_1+t_2)$ bytes in up to B bursty subblocks.

Referring now to FIG. 6, there is shown a generalized, integrated, interleaving encoder having an integrating matrix and its inverse as shown in FIG. 5 for generating sufficient redundancy to detect and correct up to $(t_1+t_2)$ bytes for each of B bursty subblocks. Each block 6001 comprises up to N data byte vectors 6003 and is applied to the integrating matrix 6005 to produce N modified data byte vectors. The modified vectors are then applied to a set of encoders 6007 such that the modified data vectors $m_1', m_2', \ldots, m_{N-B}'$ are applied to Reed-Solomon encoders or the like for providing $2t_1+2t_2$ codeword and block-level check bytes, while data vectors $m_B', m_{B+1}', \ldots, m_N'$ are applied to RS encoders providing $2t_1$ codeword-level check bytes. The codewords are then applied to "disintegrating" matrix 6013 inverse of matrix 6011 for redistribution of the data vectors, codeword and block-level check bytes. This generalized treatment occurs in the manner substantially similar to that described in connection with the embodiment shown in FIG. 3.

Another illustrative example is where a GII has an interleave ρ=3 subblock, B=3 bursty subblock correction capability, a subblock correction capability of $t_1$=5 bytes/codeword, and a burst correction capability of $t_1+t_2$=10 bytes. For any five subblocks $T_1$ to $T_5$ of which three subblocks have bytes in error, a system of this type is constrained such that the correction capacity must satisfy the following system inequalities in the manner as discussed above:

$$T_1+T_4 \leq 10$$

$$T_1+T_5 \leq 10$$

$$T_2+T_4 \leq 10$$

$$T_2+T_5 \leq 10$$

$$T_3+T_4 \leq 10$$

$$T_3+T_5 \leq 10$$

The correctable error patterns for N=5 and B=3 are tabulated as follows:

| $T_1$ | $T_2$ | $T_3$ | $T_4$ | $T_5$ | Total Correctable Errors |
|---|---|---|---|---|---|
| 10 | 10 | 10 | 0 | 0 | 30 |
| 9 | 9 | 9 | 1 | 1 | 29 |
| 8 | 8 | 8 | 2 | 2 | 28 |
| 7 | 7 | 7 | 3 | 3 | 27 |
| 6 | 6 | 6 | 4 | 4 | 26 |
| 5 | 5 | 5 | 5 | 5 | 25 |

Brief Discussion of Decoding and Syndrome Processing in the GII Embodiment

Figure 9A:
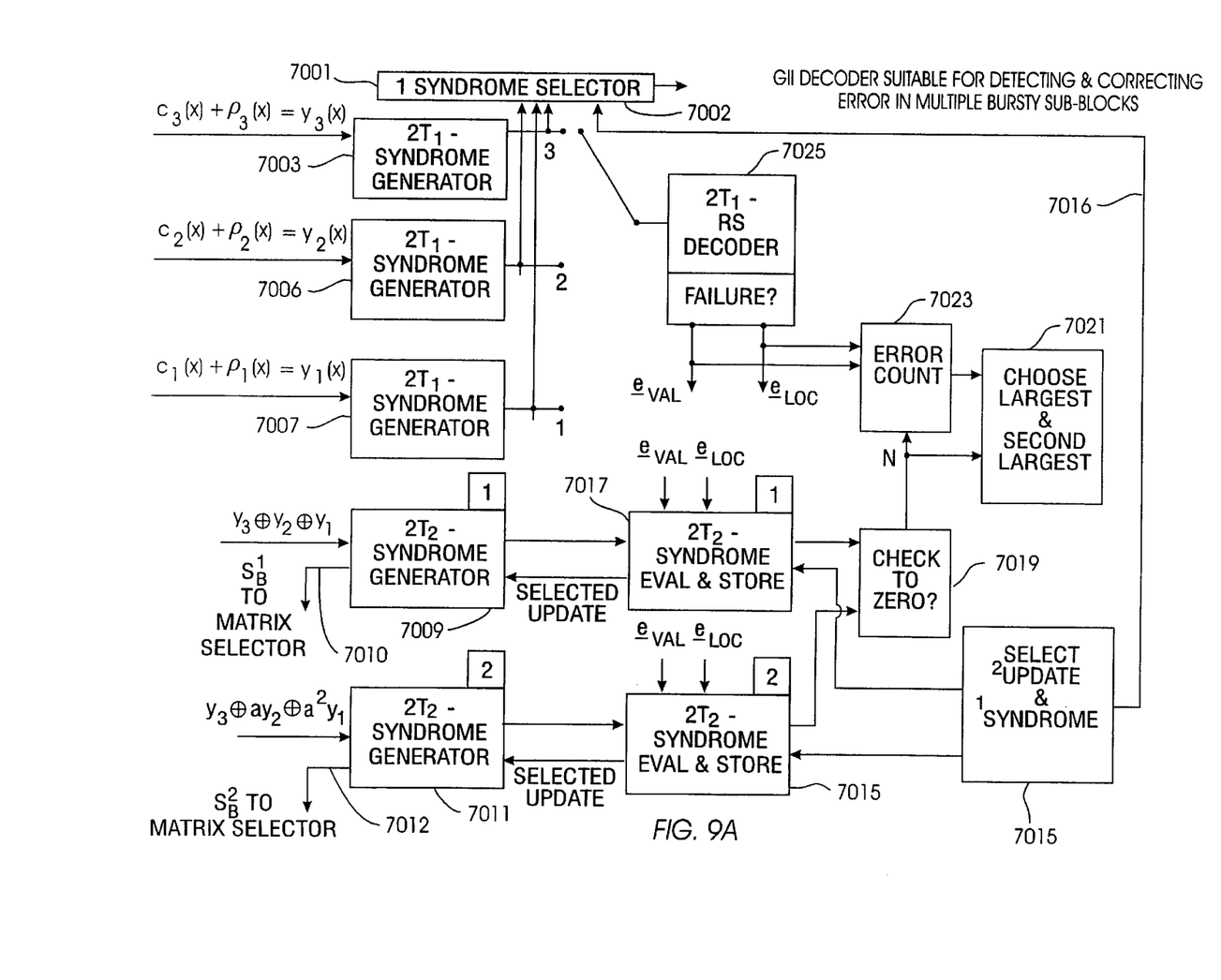
FIGS. 9A–9B depict a generalized, integrated, interleaved decoder suitable for detecting and correcting error in multiple bursty subblocks according to the invention.
Figure 9B:
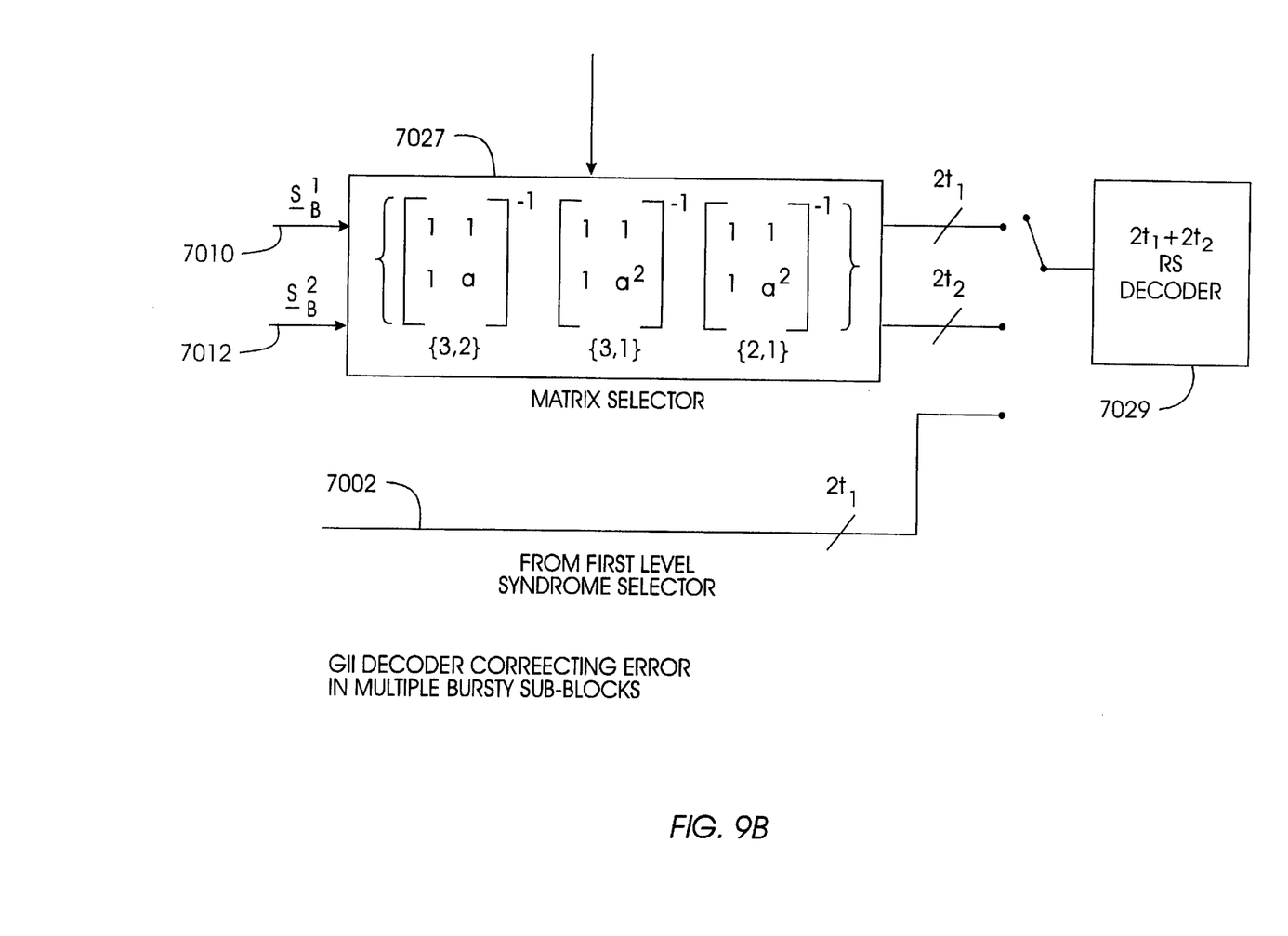

Referring now to FIGS. 9A and 9B, there is shown a generalized, integrated, interleaved decoder suitable for detecting and correcting errors in multiple bursty subblocks according to the invention. In FIG. 9A, noisy codewords $y_3(x)$, $y_2(x)$, and $y_1(x)$ are applied to respective $2t_1$ syndrome generators 7003, 7005, and 7007 where:

$$y_3(x)-c_3(x) \oplus e_3(x)$$

$$y_2(x)=c_2(x) \oplus e_2(x)$$

$$y_1(x)=c_1(x) \oplus e_1(x)$$

In this discussion, it is assumed that $y_1(x)$ and $y_2(x)$ are bursty and $y_3(x)$ is corrected by first-level RS decoder 7025.

In the operation of the decoder, it is also the case that $$y_3(x) \oplus y_2(x) \oplus y_1(x)$$
$$y_3(x) \oplus ay_2(x) \oplus a^2 y_1(x)$$

are applied as inputs to $2t_2$ syndrome generators 7009 and 7011. Now, since $y_1(x)$ and $y_2(x)$ are bursty, the syndrome generators 7009 and 7011 will provide block syndromes after being updated by any $\text{error}_3(x)$ associated with $y_3(x)$ of the form:

$$\begin{bmatrix} S_{t_2}(e_1) \\ S_{t_2}(e_2) \end{bmatrix} = \begin{bmatrix} 1 & 1 \\ a & a^2 \end{bmatrix} \cdot \begin{bmatrix} S_{t_2}(e_1(x) + e_2(x)) \\ S_{t_2}(a^2 \cdot e_1(x) + a \cdot e_2(x)) \end{bmatrix}$$

Referring now to FIG. 9B, there is shown a matrix selector 7027 storing therein three inverse 2×2 integration matrices covering two bursty subblocks. The outputs from syndrome generators 7003, 7005, and 7007 are applied to selector 7001 to define a signal on path 7002 which together with the output of generator 7009 over path 7010 and generator 7011 over path 7012 define the inverse matrix in selector 7027. The actual correction to the bursty subblocks is resolved by decoder 7029 in a manner substantially described in connection with the embodiments discussed in connection with FIGS. 7 and 8.

While the invention has been described with respect to an illustrative embodiment thereof, it will be understood that various changes may be made in the method and means herein described without departing from the scope and teaching of the invention. Accordingly, the described embodiment is to be considered merely exemplary and the invention is not to be limited except as specified in the attached claims.

What is claimed is:

1. A method for detecting and correcting multibyte errors in long byte strings either derived from a communications system or recorded on a moving storage medium of a storage device in blocks, each block comprising a plurality of codewords and a plurality of block-level check bytes derived from the codewords, each codeword including data bytes and codeword check bytes mapped from a plurality of extrinsic data byte vectors according to a linear error correction code, comprising the steps of:

(a) generating and either transmitting on the system or recording on the storage medium at least one block formed from N codewords by
      (1) creating a set of N data byte vectors m' as an interleave of elements of N extrinsically supplied data byte vectors m by matrix multiplication using a nonsingular invertible integration matrix with nonzero minors with order up to B;
      (2) mapping said set of N data byte vectors m' into a counterpart set of N codewords c' including $2t_1$ check bytes per codeword and B*(2t2) block-level check bytes;
      (3) creating a set of N modified codewords c from said set of N codewords c' by matrix multiplication of the N codewords c' by the inverse of the integration matrix; and
   (b) accessing each block either from the system or from the storage medium and processing the accessed block to detect and correct incipient bytes in error including the substeps of:
      (1) deriving syndromes from the check bytes therein, and identifying any nonzero syndromes; and
      (2) processing any identified nonzero syndromes over the codewords to correct any bytes in error using the $2t_1$ check bytes per codeword, and processing any block-level nonzero syndromes either to locate and correct $(t_1+t2)$ bytes in error in up to B bursty single codewords exceeding the correction capability of the respective codeword but within the capability of the block, or to indicate that the bytes in error exceed the correction capability of both the codeword and block levels.

2. The method according to claim 1, wherein all encoding, matrix multiplication, and syndrome processing operations are performed according to the rules of Galois field arithmetic, and further wherein the linear error correction code is a linear cyclic code of the Reed-Solomon type.

3. The method according to claim 1, wherein in step (a)(1), the set data byte vectors $\{m'(x)\}$ comprises an interleave of elements of N=3 extrinsically supplied data byte vectors m, and further wherein $m_1(x)$, $m_2(x)$, and $m_3(x) \in \{m(x)\}$ and $m_1'(x)$, $m_2'(x)$, and $m_3'(x) \in \{m'(x)\}$ such that $$\begin{bmatrix} m_3'(x) \\ m_2'(x) \\ m_1'(x) \end{bmatrix} = \begin{bmatrix} 1 & 1 & 1 \\ 1 & a & a^2 \\ 0 & 0 & 1 \end{bmatrix} \begin{bmatrix} m_3(x) \\ m_2(x) \\ m_1(x) \end{bmatrix}.$$

4. The method according to claim 1, wherein step (a)(2) for N=3 further comprises the substep of mapping the set of modified data words $m_1'(x)$, $m_2'(x)$, and $m_3'(x) \in \{m'(x)\}$ into the set of codewords $c_1'(x)$, $c_2'(x)$, and $c_3'(x) \in \{c'(x)\}$, wherein $r_B'(x)$ are block check bytes for two bursty codewords $c'(x)$ and $r_1'(x)$, $r_2'(x)$, and $r_3'(x)$ are the check bytes for codewords $c_1'(x)$, $c_2'(x)$, and $c_3'(x)$, and $t_1$ and $t_2$ are the number of codeword and block check bytes respectively, such that:

$$c_3'(x) = x^{(2t_1+2t_2)} m_3'(x) + (r_{B_1}'(x) + r_3'(x))$$

$$c_2'(x) = x^{(2t_1+2t_2)} m_2'(x) + (r_{B_2}'(x) + r_2'(x))$$

$$c_1'(x) = x^{(2t_1+2t_2)} m_1'(x) + (0 + r_1'(x)).$$

5. The method according to claim 1, wherein step (a)(3) for N=3 further comprises the substep of obtaining a set of modified codewords $c_1(x)$, $c_2(x)$, and $c_3(x) \in \{c(x)\}$ from the mapped codewords $c_1'(x)$, $c_2'(x)$, and $c_3'(x) \in \{c'(x)\}$ by the matrix multiplication of the mapped codeword vectors by the inverse of the integration matrix where $$\begin{bmatrix} c_3(x) \\ c_2(x) \\ c_3(x) \end{bmatrix} = \begin{bmatrix} 1 & 1 & 1 \\ 1 & a & a^2 \\ 0 & 0 & 1 \end{bmatrix}^{-1} \begin{bmatrix} c_3'(x) \\ c_2'(x) \\ c_1'(x) \end{bmatrix}.$$

6. The method according to claim 1, wherein step (b)(2) for N=3 further comprises the substep of:

selecting one of a set of inverse B×B minors of the integration matrices as a function of a vector of nonzero syndrome values associated with the block check bytes and detected bursty codewords; and
   correcting said codewords in error as a matrix multiplication of the selected inverse B×B minor and the vector of nonzero syndrome values.

7. The method according to claim 6, wherein the inverse B×B minor for bursty codewords {3,2}, {3,1}, or {2} is one selected from the set consisting of:

$$\left\{ \begin{bmatrix} 1 & 1 \\ 1 & a \end{bmatrix}^{-1}, \begin{bmatrix} 1 & 1 \\ 1 & a^2 \end{bmatrix}^{-1}, \begin{bmatrix} 1 & 1 \\ a & a^2 \end{bmatrix}^{-1} \right\}.$$

8. A method for detecting and correcting multibyte errors in long byte strings either derived from a communications system or recorded on a moving storage medium of a storage device in blocks, each block comprising a plurality of codewords and a plurality of block-level check bytes derived from the codewords, each codeword including data bytes and codeword check bytes mapped from a plurality of extrinsic data byte vectors according to a linear error correction code, comprising the steps of:
- (a) generating and either transmitting on the system or recording on the storage medium at least one block, each block being formed by:
  - (a1) generating a set of modified data byte vectors interleaved from a counterpart set of the extrinsic vectors as a product of the respective extrinsic vectors and a nonsingular invertible integration matrix with nonzero minors up to a predetermined order;
  - (a2) mapping the modified data byte vectors into a counterpart set of codeword vectors, said set of codeword vectors including codeword check bytes and block-level check bytes in accordance with the same linear error correction code; and
  - (a3) generating a set of modified codeword vectors as a vector product of the codeword vectors and the inverse of the integration matrix with nonzero minors such that the modified codeword vectors have data byte vector codeword check bytes, and block-level check bytes distributed in a predetermined pattern; and
- (b) accessing each block either from the system or from the storage medium on an opportunistic or scheduled basis and processing the accessed block to detect and correct incipient bytes in error including the substeps of:
  - (b1) deriving syndromes from the check bytes therein and identifying any nonzero syndromes; and
  - (b2) processing any identified nonzero syndromes over the codewords to correct any bytes in error using the codeword check bytes, and processing any block-level nonzero syndromes either to locate and correct bytes in error in one or more bursty single codewords exceeding the correction capability of the respective codeword but within the capability of the block, or to indicate that the bytes in error exceed the correction capability of both the codeword and block levels.

9. An apparatus for generating codewords in a two-level, block-formatted linear error correction code (ECC), each block comprising a plurality of codewords and a plurality of block-level check bytes derived from the codewords, each codeword comprising data bytes and check bytes derived from the data bytes in the codeword, comprising:
- (a) a first logic arrangement responsive to N extrinsically supplied data byte vectors m for creating a set of N data byte vectors m' as an interleave of elements of said data vectors m, said first arrangement including circuits for matrix multiplication of the N data byte vectors and a nonsingular invertible integration matrix with nonzero minors up to order B;
- (b) an encoder arrangement for mapping said set of N data byte vectors m' into a counterpart set of N codewords c' of a linear ECC code, said set including $2t_1$ check bytes per codeword and $B*(2t_2)$ block-level check bytes; and
- (c) a second logic arrangement for creating a set of N modified codewords c from said set of N codewords c', said second arrangement including circuits for matrix multiplication of the N codewords c' by the inverse of the integration matrix.

10. The apparatus according to claim 9, wherein said encoder arrangement includes at least one encoder for mapping a data vector into a linear error correction code of the Reed-Solomon type, and further wherein said first and second logic and said encoding arrangement perform all matrix multiplication and encoding operations according to the rules of Galois field arithmetic.

11. The apparatus according to claim 9, wherein the circuits in said first logic arrangement constitute a matrix of constant finite field multipliers, and further wherein the circuits in said second logic arrangement include circuits for redistributing the codewords into modified codewords such that the data vectors and their first-level check bytes reside in the same modified codeword and the block-level check bytes are distributed among the first-level modified codewords.

12. An article of manufacture comprising a machine-readable memory having stored therein indicia of a plurality of processor-executable control program steps for detecting and correcting multibyte errors in long byte strings derived from either a communications system or recorded on a moving storage medium of a storage device in blocks, each block comprising a plurality of codewords and a plurality of block-level check bytes derived from the codewords, each codeword including data bytes and codeword check bytes mapped from a plurality of equal-length data byte strings according to a linear error correction code, said device including a processor arrangement for executing linear error correction encoding and for detecting and correcting errors in codewords accessed from said storage medium, said indicia of the plurality of control program steps executable at the device processor arrangement include:
- (a) indicia of a first control program step for generating and either transmitting on the system or recording on the storage medium at least one block, each block being formed by:
  - (a1) generating a set of modified data byte vectors interleaved from a counterpart set of the extrinsic vectors as a product of the respective extrinsic vectors and a nonsingular invertible integration matrix with nonzero minors up to a predetermined order;
  - (a2) mapping the modified data byte vectors into a counterpart set of codeword vectors, said set of codeword vectors including codeword check bytes and block-level check bytes in accordance with the same linear error correction code; and
  - (a3) generating a set of modified codeword vectors as a vector product of the codeword vectors and the inverse of the integration matrix with nonzero minors such that the modified codeword vectors have data byte vector codeword check bytes, and block-level check bytes distributed in a predetermined pattern; and
- (b) indicia of a second control program step for accessing each block either from the system or from the storage medium on an opportunistic or scheduled basis and processing the accessed block to detect and correct incipient bytes in error including the substeps of:
  - (b1) deriving syndromes from the check bytes therein, and identifying any nonzero syndromes; and (b2) processing any identified nonzero syndromes over the codewords to correct any bytes in error using the codeword check bytes, and processing any block-level nonzero syndromes either to locate and correct bytes in error in one or more bursty single codewords exceeding the correction capability of the respective codeword but within the capability of the block, or to indicate that the bytes in error exceed the correction capability of both the codeword and block levels.

* * * * *